United States Patent
Lim

(10) Patent No.: US 12,183,897 B2
(45) Date of Patent: Dec. 31, 2024

(54) BATTERY MANAGEMENT APPARATUS, BATTERY MANAGEMENT METHOD AND BATTERY PACK

(71) Applicant: LG ENERGY SOLUTION, LTD., Seoul (KR)

(72) Inventor: Bo-Mi Lim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 664 days.

(21) Appl. No.: 17/612,497

(22) PCT Filed: Jun. 29, 2020

(86) PCT No.: PCT/KR2020/008476
§ 371 (c)(1),
(2) Date: Nov. 18, 2021

(87) PCT Pub. No.: WO2021/025295
PCT Pub. Date: Feb. 11, 2021

(65) Prior Publication Data
US 2022/0255142 A1    Aug. 11, 2022

(30) Foreign Application Priority Data
Aug. 5, 2019  (KR) ........................ 10-2019-0095075

(51) Int. Cl.
*H01M 10/42*        (2006.01)
*G01R 31/36*        (2020.01)
(Continued)

(52) U.S. Cl.
CPC ...... *H01M 10/425* (2013.01); *G01R 31/3648* (2013.01); *G01R 31/367* (2019.01);
(Continued)

(58) Field of Classification Search
CPC .. H01M 10/425; H01M 10/48; H01M 10/482; H01M 10/484; H01M 10/486;
(Continued)

(56) References Cited

U.S. PATENT DOCUMENTS 9,395,418 B2    7/2016  Rahaman et al.
10,243,385 B2   3/2019  MirTabatabaei et al.
(Continued)

FOREIGN PATENT DOCUMENTS

CN    108089130 A    5/2018
CN    108336427 A    7/2018
(Continued)

OTHER PUBLICATIONS

Office Action issued Sep. 14, 2023 for the corresponding Chinese Patent Application No. 202080032430.5 (Note: US 2006/0181245 A1, US 2004/0207367 A1 & US 2018/0143259 A1 were cited in prior IDS filings.).
(Continued)

*Primary Examiner* — Christopher P Domone
(74) *Attorney, Agent, or Firm* — Morgan, Lewis & Bockius LLP

(57) ABSTRACT

There are provided a battery management apparatus, a battery management method and a battery pack. The battery management apparatus sets at least one of a plurality of external variables as a valid external variable for each internal variable using a plurality of input data sets associated with the external variables that can be observed outside a battery cell and a plurality of desired data sets associated with the internal variables that are not observed outside the battery cell.

11 Claims, 5 Drawing Sheets

(51) Int. Cl.
*G01R 31/367* (2019.01)
*H01M 10/48* (2006.01)

(52) U.S. Cl.
CPC .. *H01M 10/486* (2013.01); *H01M 2010/4271* (2013.01); *H01M 2220/20* (2013.01)

(58) Field of Classification Search
CPC ...... H01M 10/4257; H01M 2010/4271; G01R 31/367; G01R 31/3648
See application file for complete search history.

(56) References Cited

U.S. PATENT DOCUMENTS

| | | |
|---|---|---|
| 2004/0207367 A1 | 10/2004 | Taniguchi et al. |
| 2006/0111870 A1 | 5/2006 | Plett |
| 2006/0181245 A1 | 8/2006 | Mizuno et al. |
| 2010/0312733 A1 | 12/2010 | Song et al. |
| 2013/0110429 A1 | 5/2013 | Mitsuyama et al. |
| 2013/0268466 A1 | 10/2013 | Baek et al. |
| 2014/0351177 A1 | 11/2014 | Park et al. |
| 2015/0276881 A1 | 10/2015 | Liu et al. |
| 2018/0143254 A1 | 5/2018 | Kim et al. |
| 2018/0143259 A1 | 5/2018 | Kim et al. |
| 2018/0203070 A1 | 7/2018 | Park |
| 2019/0128968 A1 | 5/2019 | Song et al. |
| 2019/0165432 A1* | 5/2019 | Park ................... G01R 31/387 |

FOREIGN PATENT DOCUMENTS

| | | |
|---|---|---|
| JP | 4689756 B1 | 5/2011 |
| JP | 2011-214843 A | 10/2011 |
| JP | 2012-154665 A | 8/2012 |
| KR | 10-2007-088761 A | 8/2007 |
| KR | 10-2013-0113296 A | 10/2013 |
| KR | 10-2014-0137181 A | 12/2014 |
| KR | 10-2018-0057266 A | 5/2018 |
| KR | 10-1952406 B1 | 2/2019 |
| KR | 10-1971875 B1 | 4/2019 |
| KR | 10-2019-0046410 A | 5/2019 |
| KR | 10-2019-0061630 A | 6/2019 |

OTHER PUBLICATIONS

Extended European Search Report dated Jul. 15, 2022 issued by the European Patent Office in corresponding European Patent Application No. 20850594.1.

Office Action dated Oct. 25, 2022, issued by the Japanese Patent Office in corresponding Japanese Patent Application No. 2021-565809.

International Search Report issued in corresponding International Patent Application No. PCT/KR2020/008476, dated Oct. 26, 2020.

* cited by examiner

BATTERY MANAGEMENT APPARATUS, BATTERY MANAGEMENT METHOD AND BATTERY PACK

TECHNICAL FIELD

The present disclosure relates to technology that analyzes a correlation between external variables and internal variables dependent on the chemical state inside a battery cell.

The present application claims the benefit of Korean Patent Application No. 10-2019-0095075 filed on Aug. 5, 2019 with the Korean Intellectual Property Office, the disclosure of which is incorporated herein by reference in its entirety.

BACKGROUND ART

Recently, there has been dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

A battery cell gradually degrades over time due to repeated charging and discharging. As the battery cell degrades, the chemical state inside the battery cell also changes. However, the internal variables (e.g., electrical conductivity of the positive electrode active material) indicating the chemical state inside the battery cell cannot be observed outside the battery cell.

Meanwhile, the chemical state inside the battery cell induces a change in external variables (e.g., the temperature of the battery cell) that can be observed outside the battery cell. Accordingly, there are attempts to estimate the internal variables based on the external variables.

However, some of the internal variables and some of the external variables may have a very low correlation. When the correlation between each internal variable and each external variable is not taken into account, the external variables estimated using the internal variables may be greatly different from the actual chemical state inside the battery cell.

DISCLOSURE

Technical Problem

The present disclosure is designed to solve the above-described problem, and therefore the present disclosure is directed to providing a battery management apparatus, a battery management method, and a battery pack that analyzes a correlation between internal variables and external variables of a battery cell.

The present disclosure is further directed to providing a battery management apparatus, a battery management method and a battery pack, in which only external variables having at least a certain level of correlation with each internal variable can be used in the modeling of a multilayer perceptron for estimation of each internal variable.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery management apparatus according to an aspect of the present disclosure includes a memory unit configured to store first to $m^{th}$ input data sets, first to $n^{th}$ desired data sets and first to $n^{th}$ reference values, and a control unit operably coupled to the memory unit. Each of m and n is a natural number of two or greater. The first to $m^{th}$ input data sets are associated with first to $m^{th}$ external variables that are observable outside the battery cell, respectively. Each of the first to $m^{th}$ input data sets includes a predetermined number of input values. The first to $n^{th}$ desired data sets are associated with first to $n^{th}$ internal variables, respectively, wherein the first to $n^{th}$ internal variables rely on a chemical state inside the battery cell and are not observable outside the battery cell. Each of the first to $n^{th}$ desired data sets includes the predetermined number of target values. The control unit is configured to set at least one of the first to $m^{th}$ external variables as a valid external variable for each of the first to $n^{th}$ internal variables based on the first to $m^{th}$ input datasets, the first to $n^{th}$ desired data sets and the first to $n^{th}$ reference values.

The memory unit may be configured to store a main multilayer perceptron that defines a correspondence relationship between the first to $m^{th}$ external variables and the first to $n^{th}$ internal variables. The control unit may be configured to obtain first to $n^{th}$ output data sets from first to $n^{th}$ output nodes included in an output layer of the main multilayer perceptron by providing the first to $m^{th}$ input data sets to first to $m^{th}$ input nodes included in an input layer of the main multilayer perceptron. Each of the first to $n^{th}$ output data sets may include the predetermined number of result values. The control unit may be configured to determine first to $n^{th}$ error factors based on the first to $n^{th}$ output data sets and the first to $n^{th}$ desired data sets. The control unit may be configured to determine the first to $n^{th}$ reference values by comparing each of the first to $n^{th}$ error factors with a threshold error factor.

The control unit may be configured to determine the $j^{th}$ error factor of the first to $n^{th}$ error factors to be equal to an error ratio of the $j^{th}$ output data set of the first to $n^{th}$ output data sets to the $j^{th}$ desired data set of the first to $n^{th}$ desired data sets. j is a natural number of n or smaller.

The control unit may be configured to set the $j^{th}$ reference value of the first to $n^{th}$ reference values to be equal to a first predetermined value when the $j^{th}$ error factor is smaller than the threshold error factor.

The control unit may be configured to set the $j^{th}$ reference value to be equal to a second predetermined value when the $j^{th}$ error factor is equal to or greater than the threshold error factor. The second predetermined value is smaller than the first predetermined value.

The control unit may be configured to determine whether to set the $i^{th}$ external variable of the first to $m^{th}$ external variables as a valid external variable for the $j^{th}$ internal variable based on the $i^{th}$ input data set of the first to $m^{th}$ input data sets, the $i^{th}$ desired data set of the first to $n^{th}$ desired data sets and the $j^{th}$ reference value of the first to $n^{th}$ reference values. The control unit may be configured to learn a sub-multilayer perceptron associated with the $j^{th}$ internal variable using the $i^{th}$ input data set as training data when the $i^{th}$ external variable is set as the effective external variable for the $j^{th}$ internal variable. i is a natural number of m or smaller, and j is a natural number of n or smaller.

The control unit may be configured to determine a multiple correlation coefficient between the $i^{th}$ input data set and the $j^{th}$ desired data set. The control unit may be configured to set the $i^{th}$ external variable as the valid external variable for the $i^{th}$ internal variable when an absolute value of the multiple correlation coefficient is greater than the $j^{th}$ reference value.

The control unit may be configured to exclude the $i^{th}$ external variable from the valid external variable for the $i^{th}$ internal variable when the absolute value of the multiple correlation coefficient is equal to or less than the $j^{th}$ reference value.

A battery pack according to another aspect of the present disclosure includes the battery management apparatus.

A battery management method according to still another aspect of the present disclosure includes storing first to $m^{th}$ input data sets, first to $n^{th}$ desired data sets and first to $n^{th}$ reference values, wherein each of m and n is a natural number of two or greater, the first to $m^{th}$ input data sets are associated with the first to $m^{th}$ external variables that can be observed outside a battery cell, respectively, each of the first to $m^{th}$ input data sets includes a predetermined number of input values, the first to $n^{th}$ desired data sets are associated with the first to $n^{th}$ internal variables that cannot be observed outside the battery cell, respectively, and each of the first to $n^{th}$ desired data sets includes the predetermined number of target values, and setting at least one of the first to m external variables as a valid external variable for each of the first to $n^{th}$ internal variables based on the first to $m^{th}$ input data sets, the first to $n^{th}$ desired data sets and the first to $n^{th}$ reference values.

The $i^{th}$ external variable of the first to $m^{th}$ external variables may be set as the valid external variable for the $j^{th}$ internal variable of the first to $n^{th}$ internal variables when an absolute value of a multiple correlation coefficient between the $i^{th}$ input data set of the first to $m^{th}$ input data sets and the $j^{th}$ desired data set of the first to $n^{th}$ desired data sets is greater than the $j^{th}$ reference value of the first to $n^{th}$ reference values. i is a natural number of m or smaller, and j is a natural number of n or smaller.

Advantageous Effects

According to at least one of the embodiments of the present disclosure, it is possible to analyze a correlation between internal variables and external variables of a battery cell.

Further, according to at least one of the embodiments of the present disclosure, only external variables having at least a certain level of correlation with each internal variable may be used in the modeling of a multilayer perceptron for estimation of each internal variable.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Figure 1:
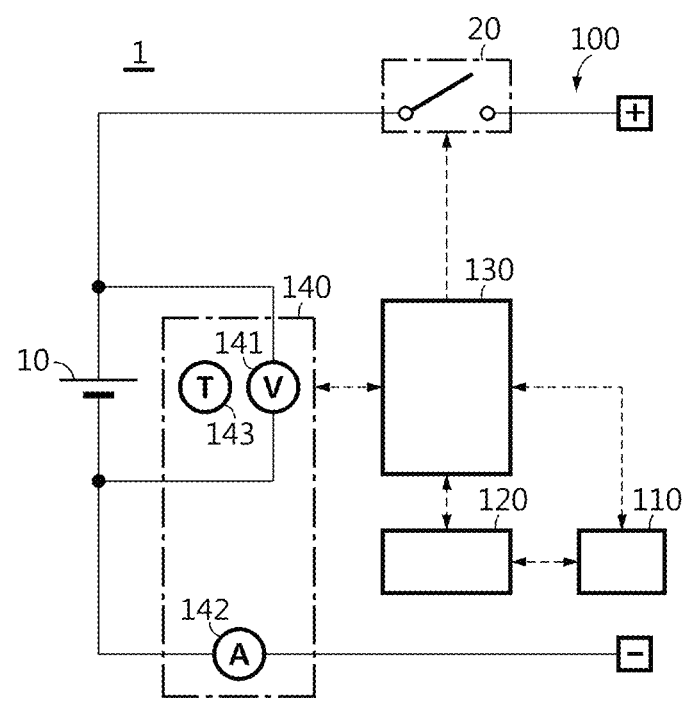
FIG. 1 is a diagram exemplarily showing a configuration of a battery pack including a battery management apparatus according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and this may be implemented by either hardware or software or a combination of hardware and software.

In addition, throughout the specification, it will be further understood that when an element is referred to as being "connected to" another element, it can be directly connected to the other element or intervening elements may be present.

Figure 2:
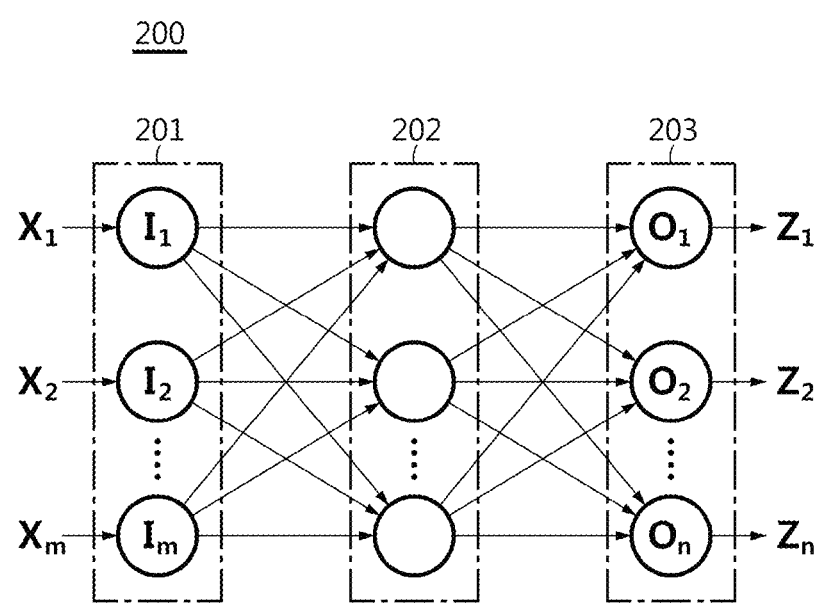
FIG. 2 is a diagram exemplarily showing a main multilayer perceptron used by the battery management apparatus of FIG. 1.
Figure 3:
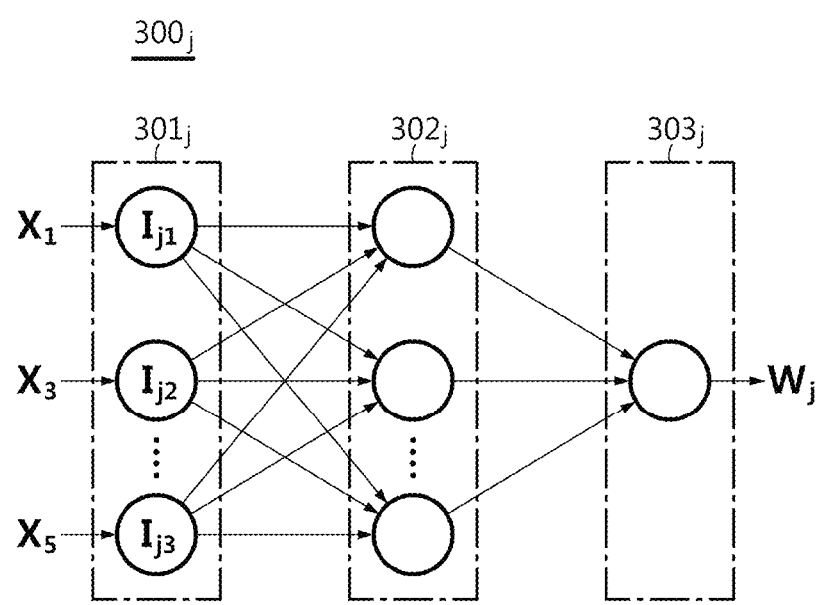
FIG. 3 is a diagram exemplarily showing a sub-multilayer perceptron.

FIG. 1 is a diagram exemplarily showing a configuration of a battery pack 1 including a battery management apparatus 100 according to an embodiment of the present disclosure, FIG. 2 is a diagram exemplarily showing a main multilayer perceptron used by the battery management apparatus 100 of FIG. 1, and FIG. 3 is a diagram exemplarily showing a sub-multilayer perceptron.

Referring to FIG. 1, the battery pack 1 includes a battery cell 10, a switch 20, and a battery management apparatus 100.

The battery pack 1 is mounted on an electricity-powered device such as an electric vehicle to supply electrical energy required to operate the electricity-powered device. The battery management apparatus 100 is provided to be electrically connected to the positive terminal and the negative terminal of the battery cell 10.

The battery cell 10 may be a lithium ion cell. The battery cell 10 may include any type that can be repeatedly charged and discharged, and is not limited to the lithium ion cell.

The battery cell 10 may be electrically coupled to an external device through power terminals (+, −) of the battery pack 1. The external device may be, for example, an electrical load (e.g., a motor), a direct current (DC)-alternating current (AC) inverter and a charger of the electric vehicle.

The switch 20 is installed on a current path connecting the positive terminal of the battery cell 10 and the power terminal (+) or the negative terminal of the battery cell 10 and the power terminal (−). While the switch 20 is in an open operating state, charging and discharging of the battery cell 10 is stopped. While the switch 20 is in a closed operating state, charging and discharging of the battery cell 10 is possible.

The battery management apparatus 100 includes an interface unit 110, a memory unit 120 and a control unit 130. The battery management apparatus 100 may further include a sensing unit 140.

The sensing unit 140 includes a voltage sensor 141, a current sensor 142 and a temperature sensor 143. The voltage sensor 141 is configured to measure the voltage across the battery cell 10. The current sensor 142 is configured to measure the current flowing through the battery cell 10. The temperature sensor 143 is configured to measure the temperature of the battery cell 10. The sensing unit 140 may transmit sensing data indicating the measured voltage, the measured current, and the measured temperature to the control unit 130.

The interface unit 110 may be coupled to the external device to enable communication between. The interface unit 110 is configured to support wired communication or wireless communication between the control unit 130 and the external device. The wired communication may be, for example, controller area network (CAN) communication, and the wireless communication may be, for example, ZigBee or Bluetooth communication. The interface unit 110 may include an output device such as a display or a speaker to provide the results of each operation performed by the control unit 130 in a form that can be recognized by a user. The interface unit 110 may include an input device such as a mouse and a keyboard to receive data from the user.

The memory unit 120 is operably coupled to at least one of the interface unit 110, the control unit 130 or the sensing unit 140. The memory unit 120 may store the results of each operation performed by the control unit 130. The memory unit 120 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The memory unit 120 is configured to store various data required to estimate the chemical state inside the battery cell 10. Specifically, the memory unit 120 stores a first number of input data sets and a second number of desired data sets. The memory unit 120 may further store the main multilayer perceptron. Hereinafter, it is assumed that the first number is m, the second number is n, and each of m and n is a natural number of 2 or greater. For example, the first to $m^{th}$ input data sets and the first to nth desired data sets transmitted from an external device are stored in the memory unit 120 through the interface unit 110.

The first to $m^{th}$ input data sets are associated with first to $m^{th}$ external variables that are observable outside the battery cell 10, respectively. That is, when a first index i is a natural number of 1 to m (i.e., a natural number of m or smaller), the $i^{th}$ input data set is associated with the $i^{th}$ external variable. Each input data set includes a third number (e.g., 10000) of input values. For example, the third number of values preset as the $i^{th}$ external variable are included in the $i^{th}$ input data set. In the specification, $X_i$ denotes the $i^{th}$ input data set, and $X_i(k)$ denotes the $k^{th}$ input value of the $i^{th}$ input data set.

For example, when m=16, the first to sixteenth external variables may be defined as follows.

The first external variable may indicate the period of time from the time point when a state of charge (SOC) of the battery cell 10 is equal to a first charge state (e.g., 100%) to the time point when the voltage of the battery cell 10 reaches a first voltage (e.g., 3.0 V) by a first test of discharge of the battery cell 10 with a current of a first current rate (e.g., ⅓ C) at a first temperature.

The second external variable may indicate the voltage of the battery cell 10 at the time point when a second test is performed for a first reference time (e.g., 0.1 sec), and in the second test, the battery cell 10 is discharged with a current of a second current rate (e.g., 200 A) at a second temperature from the time point when the SOC of the battery cell 10 is equal to a second charge state (e.g., 50%).

The third external variable may indicate the voltage of the battery cell 10 at the time point when the second test is performed for a second reference time (e.g., 1.0 sec) that is longer than the first reference time.

The fourth external variable may indicate the voltage of the battery cell 10 at the time point when the second test is performed for a third reference time (e.g., 10.0 sec) that is longer than the second reference time.

The fifth external variable may indicate the voltage of the battery cell 10 at the time point when the second test is performed for a fourth reference time (e.g., 30.0 sec) that is longer than the third reference time.

The sixth external variable may include the period of time from the time point when the SOC of the battery cell 10 is equal to a third SOC (e.g., 100%) to the time point when the voltage of the battery cell 10 reaches a second voltage (e.g., 3.8 V) by a third test of discharge of the battery cell 10 with a current of a third current rate (e.g., 1.0 C) at a third temperature.

The seventh external variable may indicate the period of time until the time point when the voltage of the battery cell 10 reaches a third voltage (e.g., 3.5 V) that is lower than the second voltage by the third test.

The eighth external variable may represent the time taken for the voltage of the battery cell 10 to reduce from the second voltage to the third voltage by the third test.

The ninth external variable may indicate the voltage of the battery cell 10 at the time point when a fourth test of discharge of the battery cell 10 with a current of a fourth current rate (e.g., 1.0 C) at a fourth temperature is performed for a fifth reference time (e.g., 0.1 sec) from the time point when the SOC of the battery cell 10 is equal to a fourth charge state (e.g., 10%).

The tenth external variable may indicate the voltage of the battery cell 10 at the time point when the fourth test is performed for a sixth reference time (e.g., 1.0 sec) that is longer than the fifth reference time.

The eleventh external variable may indicate the voltage of the battery cell 10 at the time point when the fourth test is performed for a seventh reference time (e.g., 10.0 sec) that is longer than the sixth reference time.

The twelfth external variable may indicate the voltage of the battery cell 10 at the time point when the fourth test is performed for an eighth reference time (e.g., 30.0 sec) that is longer than the seventh reference time.

The thirteenth external variable may indicate the voltage of the battery cell 10 at the time point when the fourth test is performed for a ninth reference time (e.g., 100.0 sec) that is longer than the eighth reference time.

The fourteenth external variable may indicate a ratio between a voltage change of the battery cell 10 during a first period (e.g., 0.0 to 0.1 sec) and a voltage change of the battery cell 10 during a second period (e.g., 20.0 to 20.1 sec) by a fifth test of charge of the battery cell 10 with a current of a fifth current rate (e.g., 1.0 C) at a fifth temperature from the time when the SOC of the battery cell 10 is equal to a fifth state (e.g., 10%).

The fifteenth external variable may indicate the voltage of the first peak on a differential capacity curve of the battery cell 10 obtained by a sixth test of charge of the battery cell 10 with a current of a sixth current rate (e.g., 0.04 C) at a sixth temperature from the time point when the SOC of the battery cell 10 is equal to a sixth SOC (e.g., 0%). When V, dV and dQ are the voltage of the battery cell 10, a voltage change of the battery cell 10, and a capacity change of the battery cell 10, respectively, the differential capacity curve shows a correspondence relationship between V and dQ/dV. The differential capacity curve may be referred to as 'V-dQ/dV curve'. The first peak may be a peak having the smallest V among a plurality of peaks on the differential capacity curve.

The sixteenth external variable may indicate a difference between the voltage of the first peak and a reference voltage. The reference voltage is the voltage of the first peak of the differential capacity curve obtained when the battery cell 10 is at Beginning Of Life (BOL), and may be preset.

The first to $n^{th}$ desired data sets are associated with the first to $n^{th}$ internal variables that are not observable outside the battery cell 10, respectively. That is, when a second index j is a natural number of 1 to n (i.e., a natural number of n or smaller), the $j^{th}$ desired data set is associated with the $j^{th}$ internal variable. Each internal variable indicates the chemical state inside the battery cell 10. Each desired data set includes the third number of target values. For example, the third number of values preset as the $j^{th}$ internal variable are included in the $j^{th}$ desired data set. In the specification, $Y_j$ denotes the $j^{th}$ desired data set, and $Y_j(k)$ denotes the $k^{th}$ target value of the $i^{th}$ desired data set.

$Y_1(k)$ to $Y_n(k)$ are expected values of the first to $n^{th}$ internal variables when the battery cell 10 has a specific degradation state. $X_1(k)$ to $X_m(k)$ are expected values of the first to $m^{th}$ external variables induced by $Y_1(k)$ to $Y_n(k)$ when the battery cell 10 has the specific degradation state.

The degradation state of the battery cell 10 changes depending on the environment in which the battery cell 10 is used, and each degradation state may be defined by a combination of the first to $n^{th}$ internal variables. When a≠b, $X_1(a)$ to $X_m(a)$ and $Y_1(a)$ to $Y_n(a)$ are associated with 'a' degradation state, and $X_1(b)$ to $X_m(b)$ and $Y_1(b)$ to $Y_n(b)$ are associated with 'b' degradation state that is different from the 'a' degradation state of the battery cell 10.

For example, when n=14, the first to fourteenth internal variables may be defined as follows.

The first internal variable may be the electrical conductivity of the positive electrode of the battery cell 10.

The second internal variable may be the ionic diffusivity of the positive electrode active material of the battery cell 10.

The third internal variable may be the rate constant of the exchange current density of the positive electrode active material of the battery cell 10.

The fourth internal variable may be the ionic diffusivity of the negative active material of the battery cell 10.

The fifth internal variable may be the rate constant of the exchange current density of the negative active material of the battery cell 10.

The sixth internal variable may be the tortuosity of the negative electrode of the battery cell 10. The tortuosity is the ratio of the actual distance traveled by an ion from one point to the other relative to the straight line distance between the two points.

The seventh internal variable may be the porosity of the negative electrode of the battery cell 10.

The eighth internal variable may be the ion concentration of the electrolyte of the battery cell 10.

The ninth internal variable may be a scale factor that multiplies the initial ionic conductivity of the electrolyte of the battery cell 10. The initial ionic conductivity may be a preset value indicating the ionic conductivity of the electrolyte of the battery cell 10 when the battery cell 10 is at BOL.

The tenth internal variable may be a scale factor that multiplies the initial ionic diffusivity of the electrolyte of the battery cell 10. The initial ionic diffusivity may be a preset value indicating the ionic diffusivity of the electrolyte of the battery cell 10 when the battery cell 10 is at BOL.

The eleventh internal variable may be the cation transference number of the electrolyte of the battery cell 10. The transference number indicates the fractional contribution of cations (e.g., Li+) to the electrical conductivity of the electrolyte.

The twelfth internal variable may be the Loss of Lithium Inventory (LLI) of the battery cell 10. The LLI indicates how much lithium in the battery cell 10 has decreased compared to BOL.

The thirteenth internal variable may be the Loss of Active Material (LAM) of the positive electrode of the battery cell 10. The LAM of the positive electrode indicates how much the positive electrode active material of the battery has decreased compared to the BOL.

The fourteenth internal variable may be the LAM of the negative electrode of the battery cell 10. The LAM of the negative electrode indicates how much the negative electrode active material of the battery has decreased compared to BOL.

The first to $m^{th}$ input data sets and the first to $n^{th}$ desired data sets may be preset from the simulation results of different battery cells having the same specifications as the battery cell 10.

The control unit 130 is operably coupled to at least one of the interface unit 110, the memory unit 120 or the sensing unit 140. The control unit 130 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions.

The control unit 130 determines first to $n^{th}$ reference values required for the modeling of the first to n-th sub-multilayer perceptrons using the main multilayer perceptron.

Referring to FIG. 2, the main multilayer perceptron 200 includes an input layer 201, a predetermined number of intermediate layers 202 and an output layer 203. In the main multilayer perceptron 200, the number of nodes (also referred to as 'neurons') included in each layer, connections between nodes and functions of each node included in each intermediate layer may be preset. Weights for each connection may be set using predetermined training data.

The input layer 201 includes first to $m^{th}$ input nodes $I_1$ to $I_m$. The first to $m^{th}$ input nodes $I_1$ to $I_m$ are associated with the first to $m^{th}$ external variables, respectively. Each input value included in the $i^{th}$ input data set $X_i$ is provided to the $i^{th}$ input node $I_i$.

The output layer 203 includes first to $n^{th}$ output nodes $O_1$ to $O_n$. The first to $n^{th}$ output nodes $O_1$ to $O_n$ are associated with the first to $n^{th}$ internal variables, respectively.

When the $k^{th}$ input value of each of the first to $m^{th}$ input data sets $X_1$ to $X_m$ is input to the first to $m^{th}$ input nodes $I_1$ to $I_m$, respectively, the $k^{th}$ result value of each of the first to $n^{th}$ output data sets $Z_1$ to $Z_n$ is output from the first to $n^{th}$ output nodes $O_1$ to $O_n$, respectively.

The control unit 130 may generate first to $n^{th}$ output data sets $Z_1$ to $Z_n$, each having the third number of result values by repeating the process of inputting m input values (e.g., $X_1(k)$ to $X_m(k)$) of the same order in the first to $m^{th}$ input data sets $X_1$ to $X_m$ to the first to $m^{th}$ input nodes $I_1$ to $I_m$, respectively. In the specification, 4 refers to the $j^{th}$ output data set, and $Z_j(k)$ refers to the $k^{th}$ result value of the $j^{th}$ output data set. In the first to $n^{th}$ output data sets, n result values $Z_1(k)$ to $Z_n(k)$ may be arranged in the same order.

The control unit 130 may determine first to $n^{th}$ error factors based on the first to $n^{th}$ output data sets and the first to $n^{th}$ desired data sets. That is, the control unit 130 may determine the $j^{th}$ error factor by comparing the $j^{th}$ output data set with the $j^{th}$ desired data set. Specifically, the control unit 130 may determine the $j^{th}$ error factor using the following Equation 1.

$$F_{error\_j} = \sum_{k=0}^{u} \left| \frac{Y_j(k) - Z_j(k)}{Y_j(k)} \right| \times 100(\%) \qquad < \text{Equation 1} >$$

In Equation 1, u is the third number and $F_{error\_j}$ is the $j^{th}$ error factor. That is, the $j^{th}$ error factor may be determined to be equal to an error ratio of the $j^{th}$ output data set to the $j^{th}$ desired data set.

The control unit 130 may determine the first to $n^{th}$ reference values by comparing the first to $n^{th}$ error factors with a threshold error factor, respectively. The threshold error factor may be a preset, for example, 3%. Specifically, when the $j^{th}$ error factor is smaller than the threshold error factor, the control unit 130 may determine the $j^{th}$ reference value to be equal to a first predetermined value. On the contrary, when the $j^{th}$ error factor is equal to or greater than the threshold error factor, the control unit 130 may determine the $j^{th}$ reference value to be equal to a second predetermined value. The second predetermined value (e.g., 0.25) may be smaller than the first predetermined value (e.g., 0.50). The process using the main multilayer perceptron 200 may be completed by determining the first to $n^{th}$ reference values. Alternatively, each of the first to $n^{th}$ reference values may be preset to the first predetermined value or the second predetermined value. In this case, the process using the main multilayer perceptron 200 may be omitted.

The control unit 130 performs a process for determining the first to $n^{th}$ sub-multilayer perceptrons.

The control unit 130 determines a multiple correlation coefficient between each of the first to $n^{th}$ desired data sets and each of the first to $m^{th}$ input data sets. The multiple correlation coefficient between the $i^{th}$ input data set and the $j^{th}$ desired data set may be determined from the following Equation 2.

$$r_{i,j} = \frac{\sum_{k=1}^{N} X_i(k) Y_j(k) - \frac{\sum_{k=1}^{N} X_i(k) \sum_{k=1}^{N} Y_j(k)}{N}}{\sqrt{\sum_{k=1}^{N} X_i(k)^2 - \frac{\left(\sum_{k=1}^{N} X_i(k)\right)^2}{N}} \sqrt{\sum_{k=1}^{N} Y_j(k)^2 - \frac{\left(\sum_{k=1}^{N} Y_j(k)\right)^2}{N}}} \qquad < \text{Equation 2} >$$

In Equation 2, N is the third number, and $r_{i,j}$ is the multiple correlation coefficient between the $i^{th}$ input data set and the $j^{th}$ desired data set. m multiple correlation coefficients may be determined for each desired data set, and a total of m×n multiple correlation coefficients may be determined.

The absolute value of the multiple correlation coefficient $r_{i,j}$ being greater than the $j^{th}$ reference value indicates a high correlation between the $i^{th}$ external variable and the $j^{th}$ internal variable. When the absolute value of the multiple correlation coefficient $r_{i,j}$ is greater than the $j^{th}$ reference value, the control unit 130 may determine to use the $i^{th}$ input data set for the modeling of the $j^{th}$ sub-multilayer perceptron. When the absolute value of the multiple correlation coefficient $r_{i,j}$ is greater than the $j^{th}$ reference value, the control unit 130 may set the $i^{th}$ external variable as a valid external variable for the $j^{th}$ internal variable.

On the contrary, the absolute value of the multiple correlation coefficient $r_{i,j}$ being equal to or less than the $j^{th}$ reference value indicates a low correlation between the $i^{th}$ external variable and the $j^{th}$ internal variable. When the absolute value of the multiple correlation coefficient $r_{i,j}$ is equal to or less than the $j^{th}$ reference value, the control unit 130 may determine not to use the $i^{th}$ input data set for the modeling of the $j^{th}$ sub-multilayer perceptron. That is, the control unit 130 may exclude the $i^{th}$ external variable from a valid external variable for the $j^{th}$ internal variable.

The control unit 130 may generate the first to $n^{th}$ sub-multilayer perceptrons associated with the first to $n^{th}$ internal variables, respectively. That is, the $j^{th}$ internal variable and the $j^{th}$ sub-multilayer perceptron are associated with each other. The $j^{th}$ sub-multilayer perceptron is used to estimate the value of the $j^{th}$ internal variable.

Referring to FIG. 3, the $j^{th}$ sub-multilayer perceptron 300$_j$ includes an input layer 301$_j$, a predetermined number of intermediate layers 302$_j$ and an output layer 303$_j$. The function of each node included in each intermediate layer 302$_j$ may be preset. The output layer 303 has a single output node associated with the $i^{th}$ internal variable.

The control unit 130 may generate the same number of input nodes of the input layer 301 of the $j^{th}$ sub-multilayer perceptron as the number of valid external variables sets for the $j^{th}$ internal variable. FIG. 3 shows that each of the first, third, and fifth external variables is set as a valid external variable for the $j^{th}$ internal variable.

The input layer 301$_j$ of the $j^{th}$ sub-multilayer perceptron has three input nodes $I_{j1}$ to $I_{j3}$. The first, third and fifth input data sets associated with each of the three external variables are provided as training data to each of the three input nodes $I_{j1}$ to $I_{j3}$, and the $j^{th}$ sub-multilayer perceptron 300$j$ is learned through comparison between the result values of the data set $W_j$ obtained from the output layer of the $j^{th}$ sub-multilayer perceptron and target values of the $j^{th}$ desired data set.

After the learning of the $j^{th}$ sub-multilayer perceptron $300_j$ is completed, the control unit 130 may measure the voltage, the current and the temperature of the battery cell 10 using the sensing unit 140. The control unit 130 may determine values of three external variables based on the sensing data from the sensing unit 140. Subsequently, the control unit 130 inputs the values of the three external variables to the three input nodes $I_{j1}$ to $I_{j3}$ of the $j^{th}$ sub-multilayer perceptron $300_j$, respectively, so that the result value may be obtained in the output layer $303_j$ of the $j^{th}$ sub-multilayer perceptron $300_j$. The corresponding result value is an estimated value of the $j^{th}$ internal variable associated with the degradation state corresponding to the values of the three external variables. When the estimated value of the $j^{th}$ internal variable is outside of a predetermined $j^{th}$ safety range, the control unit 130 may control the switch 20 into the open operating state to protect the battery cell 10.

Figure 4:
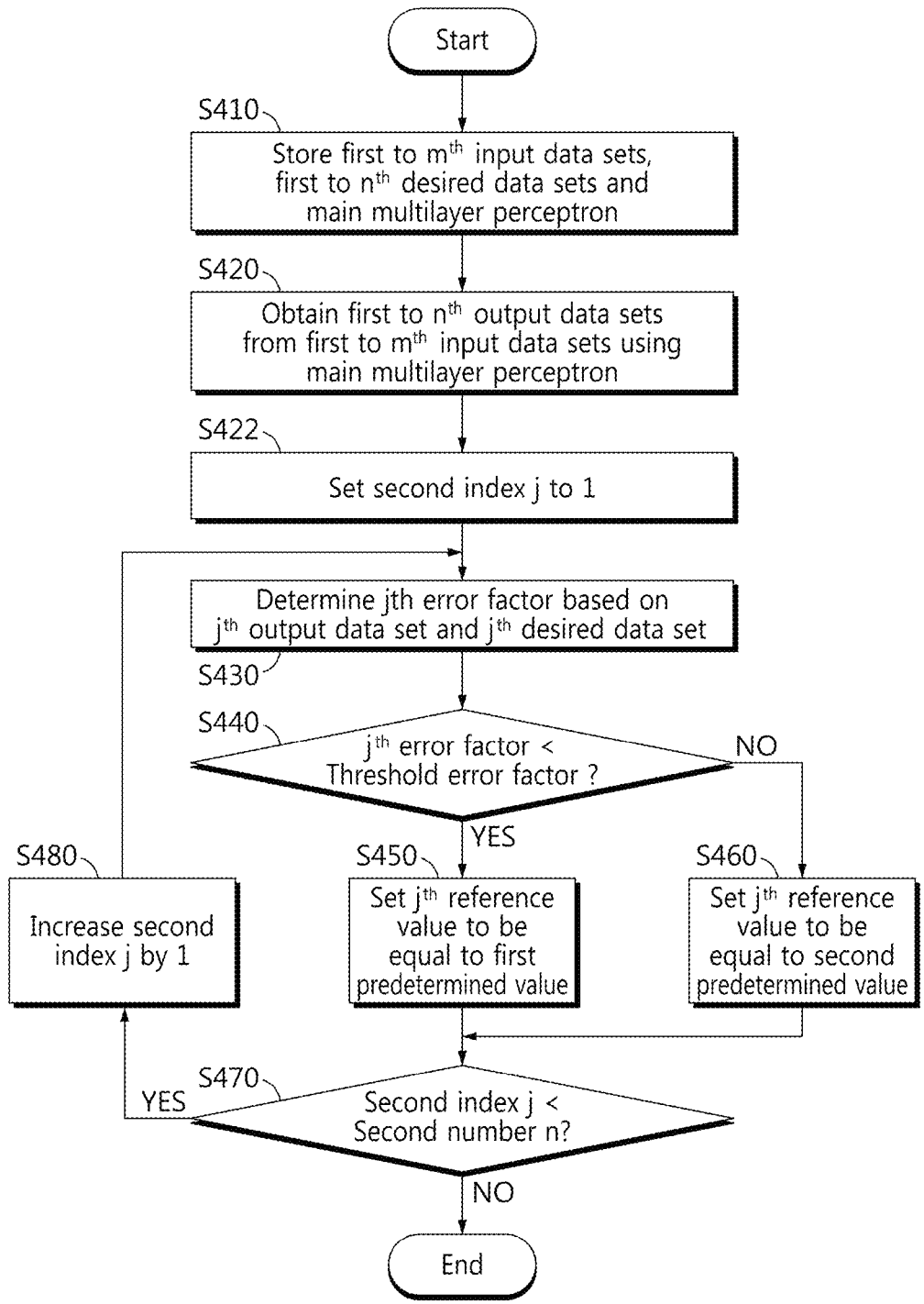
FIG. 4 is a flowchart exemplarily showing a method that may be performed by the battery management apparatus of FIG. 1.

FIG. 4 is a flowchart exemplarily showing a method that may be performed by the battery management apparatus 100 of FIG. 1.

Referring to FIGS. 1 to 4, in step S410, the control unit 130 stores first to $m^{th}$ input data sets, first to $n^{th}$ desired data sets and a main multilayer perceptron 200 in the memory unit 120.

In step S420, the control unit 130 obtains first to $n^{th}$ output data sets from the first to $m^{th}$ input data sets using the main multilayer perceptron 200.

In step S422, the control unit 130 sets a second index j to 1.

In step S430, the control unit 130 determines a $j^{th}$ error factor based on the $j^{th}$ output data set and the $j^{th}$ desired data set.

In step S440, the control unit 130 determines whether the $j^{th}$ error factor is smaller than a threshold error factor. When a value of the step S440 is "YES", step S450 is performed. When the value of the step S440 is "NO", step S460 is performed.

In step S450, the control unit 130 sets a $j^{th}$ reference value to be equal to a first predetermined value.

In step S460, the control unit 130 sets the $j^{th}$ reference value to be equal to a second predetermined value.

In step S470, the control unit 130 determines whether the second index j is less than a second number n. When a value of the step S470 is "YES", step S480 is performed.

In step S480, the control unit 130 increases the second index j by 1. After the step S480 is completed, the process returns to the step S430.

The first to nth reference values may be determined in a sequential order through the method of FIG. 4. After the first to nth reference values are determined through the method of FIG. 4, the control unit 130 may perform the method of FIG. 5.

Figure 5:
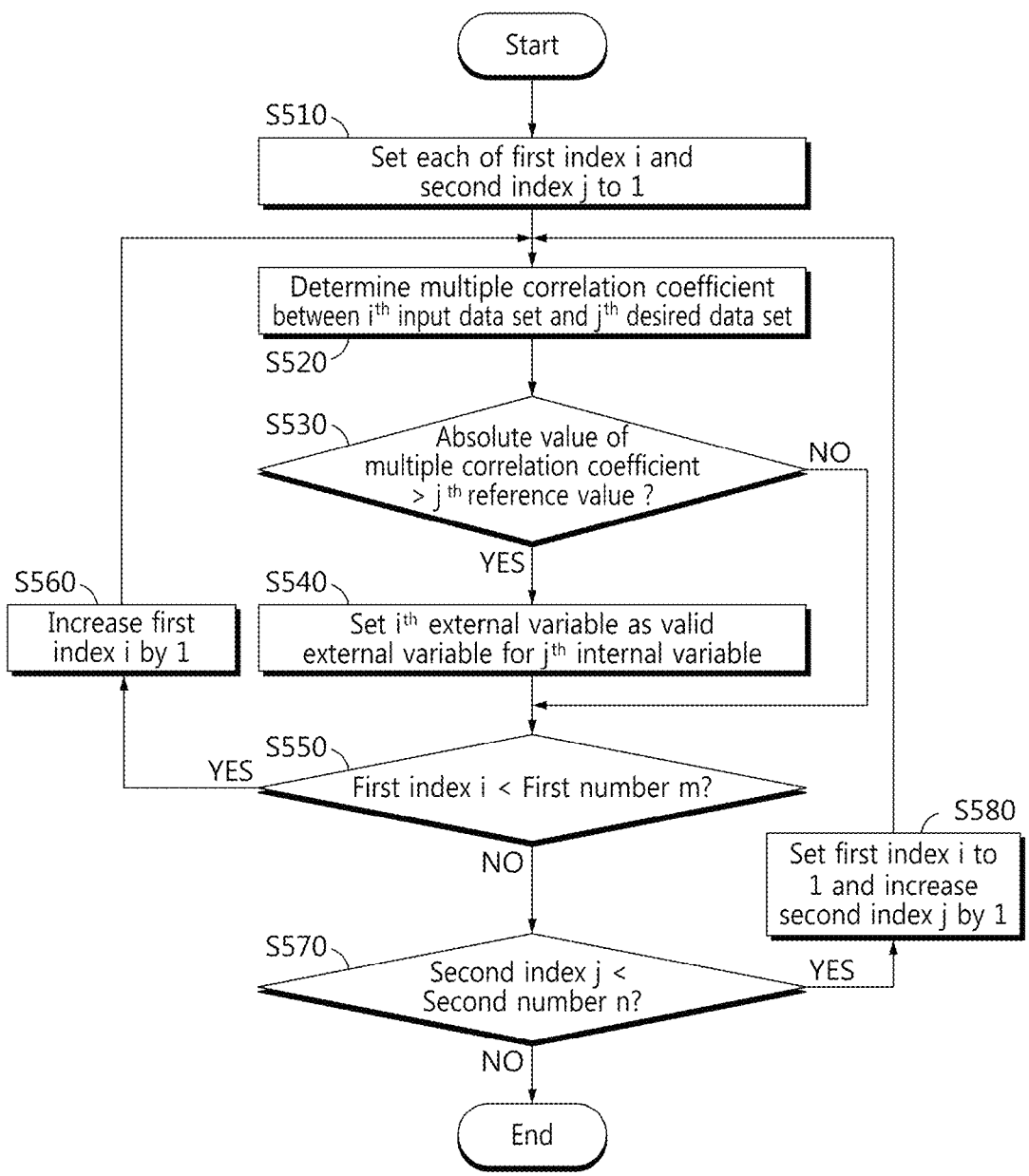
FIG. 5 is a flowchart exemplarily showing another method that may be performed by the battery management apparatus of FIG. 1.

Alternatively, when the first to $n^{th}$ reference values are preset and stored in the memory unit 120 as described above, the control unit 130 may perform the method of FIG. 5 without performing the method of FIG. 4.

FIG. 5 is a flowchart exemplarily showing another method that may be performed by the battery management apparatus 100 of FIG. 1.

Referring to FIGS. 1 to 5, in step S510, the control unit 130 sets each of a first index i and a second index j to 1.

In step S520, the control unit 130 determines a multiple correlation coefficient between an $i^{th}$ input data set and a $j^{th}$ desired data set.

In step S530, the control unit 130 determines whether the absolute value of the multiple correlation coefficient is greater than a $j^{th}$ reference value. When a value of the step S530 is "YES", step S540 is performed. When the value of the step S530 is "NO", step S550 is performed.

In step S540, the control unit 130 sets an $i^{th}$ external variable as a valid external variable for a $j^{th}$ internal variable.

In step S550, the control unit 130 determines whether the first index i is less than a first number m. When a value of the step S550 is "YES", step S560 is performed. When the value of the step S550 is "NO", step S570 is performed.

In step S560, the control unit 130 increases the first index i by 1. After the step S560 is completed, the process returns to the step S520.

In step S570, the control unit 130 determines whether the second index j is less than a second number n. When a value of the step S570 is "YES", step S580 is performed.

In step S580, the control unit 130 sets the first index i to 1, and increases the second index j by 1. After the step S580 is completed, the process returns to the step S520.

The value of the step S550 being "NO" indicates that the setting of the valid external variable for the $j^{th}$ internal variable is completed. Each time the value of the step S550 is "NO", the control unit 130 may generate a $j^{th}$ sub-multilayer perceptron to be used to estimate the value of the $j^{th}$ internal variable.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery management apparatus, comprising:
a memory unit configured to store first to $m^{th}$ input data sets, first to $n^{th}$ desired data sets, and first to $n^{th}$ reference values, each of m and n being a natural number of two or greater; and
a control unit operably coupled to the memory unit,
wherein the first to $m^{th}$ input data sets are associated with first to $m^{th}$ external variables that are observable outside the battery cell, respectively,
wherein each of the first to $m^{th}$ input data sets includes a predetermined number of input values,
wherein the first to $n^{th}$ desired data sets are associated with first to $n^{th}$ internal variables, respectively,
wherein the first to $n^{th}$ internal variables rely on a chemical state inside the battery cell, and are not observable outside the battery cell, wherein each of the first to $n^{th}$ desired data sets includes the predetermined number of target values, and wherein the control unit is configured to set at least one of the first to $m^{th}$ external variables as a valid external variable for each of the first to $n^{th}$ internal variables, based on the first to $m^{th}$ input datasets, the first to $n^{th}$ desired data sets, and the first to $n^{th}$ reference values.

2. The battery management apparatus according to claim 1, wherein:

the memory unit is further configured to store a main multilayer perceptron that defines a correspondence relationship between:

the first to $m^{th}$ external variables; and the first to $n^{th}$ internal variables; and the control unit is further configured to:

obtain first to $n^{th}$ output data sets from first to $n^{th}$ output nodes included in an output layer of the main multilayer perceptron by providing the first to $m^{th}$ input data sets to first to $m^{th}$ input nodes included in an input layer of the main multilayer perceptron, each of the first to $n^{th}$ output data sets including the predetermined number of result values;

determine first to $n^{th}$ error factors, based on;

the first to $n^{th}$ output data sets; and the first to $n^{th}$ desired data sets; and determine the first to $n^{th}$ reference values by comparing each of the first to $n^{th}$ error factors with a threshold error factor.

3. The battery management apparatus according to claim 2, wherein:

the control unit is further configured to determine the $j^{th}$ error factor of the first to $n^{th}$ error factors to be equal to an error ratio of the $j^{th}$ output data set of the first to $n^{th}$ output data sets to the $j^{th}$ desired data set of the first to $n^{th}$ desired data sets; and j is a natural number of n or smaller.

4. The battery management apparatus according to claim 3, the control unit is further configured to set the $j^{th}$ reference value of the first to $n^{th}$ reference values to be equal to a first predetermined value when the $j^{th}$ error factor is smaller than the threshold error factor.

5. The battery management apparatus according to claim 4, wherein:

the control unit is further configured to set the $j^{th}$ reference value to be equal to a second predetermined value when the $j^{th}$ error factor is equal to or greater than the threshold error factor; and wherein the second predetermined value is smaller than the first predetermined value.

6. The battery management apparatus according to claim 1, wherein:

the control unit is further configured to:

determine whether to set the $i^{th}$ external variable of the first to $m^{th}$ external variables as a valid external variable for the $j^{th}$ internal variable, based on the $i^{th}$ input data set of the first to $m^{th}$ input data sets, the $j^{th}$ desired data set of the first to $n^{th}$ desired data sets, and the $j^{th}$ reference value of the first to $n^{th}$ reference values, and learn a sub-multilayer perceptron associated with the $j^{th}$ internal variable using the $i^{th}$ input data set as training data when the $i^{th}$ external variable is set as the effective external variable for the $j^{th}$ internal variable;

i is a natural number of m or smaller; and j is a natural number of n or smaller.

7. The battery management apparatus according to claim 6, wherein the control unit is further configured to:

determine a multiple correlation coefficient between the $i^{th}$ input data set and the $j^{th}$ desired data set; and set the $i^{th}$ external variable as the valid external variable for the $j^{th}$ internal variable when an absolute value of the multiple correlation coefficient is greater than the $j^{th}$ reference value.

8. The battery management apparatus according to claim 7, wherein the control unit is further configured to exclude the $i^{th}$ external variable from the valid external variable for the $j^{th}$ internal variable when the absolute value of the multiple correlation coefficient is equal to or less than the $j^{th}$ reference value.

9. A battery pack comprising the battery management apparatus according to claim 1.

10. A battery management method, comprising:

storing first to $m^{th}$ input data sets, first to $n^{th}$ desired data sets, and first to $n^{th}$ reference values, each of m and n being a natural number of two or greater, the first to $m^{th}$ input data sets being associated with the first to $m^{th}$ external variables that are observable outside a battery cell, respectively, each of the first to $m^{th}$ input data sets including a predetermined number of input values, the first to $n^{th}$ desired data sets being associated with the first to $n^{th}$ internal variables that are not observable outside the battery cell, respectively, each of the first to $n^{th}$ desired data sets including the predetermined number of target values; and setting at least one of the first to m external variables as a valid external variable for each of the first to $n^{th}$ internal variables, based on the first to $m^{th}$ input data sets, the first to $n^{th}$ desired data sets, and the first to $n^{th}$ reference values.

11. The battery management method according to claim 10, wherein:

the $i^{th}$ external variable of the first to $m^{th}$ external variables is set as the valid external variable for the $j^{th}$ internal variable of the first to $n^{th}$ internal variables when an absolute value of a multiple correlation coefficient between the $i^{th}$ input data set of the first to $m^{th}$ input data sets and the $j^{th}$ desired data set of the first to $n^{th}$ desired data sets is greater than the $j^{th}$ reference value of the first to $n^{th}$ reference values;

i is a natural number of m or smaller; and j is a natural number of n or smaller.

\* \* \* \* \*